Nov. 21, 1961 L. E. PEPPERBERG 3,010,015

REMOTE ELECTRICAL TUNER FOR RADIO APPARATUS

Filed Dec. 31, 1957

INVENTOR.

Louis E. Pepperberg

BY Mueller & Aichele

Attys.

United States Patent Office 3,010,015
Patented Nov. 21, 1961

3,010,015

REMOTE ELECTRICAL TUNER FOR RADIO APPARATUS

Louis E. Pepperberg, Highland Park, Ill., assignor to Motorola, Inc., Chicago, Ill., a corporation of Illinois Filed Dec. 31, 1957, Ser. No. 706,484
6 Claims. (Cl. 250—20)

This invention relates generally to frequency selective devices, and more particularly to a remote control electrical tuning system for radio receivers.

Radio receivers have been proposed having saturable reactors for providing variable inductance tuning. Such receivers are adapted to be remotely controlled, and the receiver proper can be mounted in the trunk of an automobile and can be tuned electrically by operating a control device which is mounted on the dashboard of the automobile. It has been found, however, to be difficult to provide sufficient inductance variation to tune through the wide frequency range required without impairing the quality factors or Q's of the tuned circuits in the receiver over some part of the tuning range. Since the resonant frequency of a tuned circuit varies inversely with the product of its inductance and capacitance values, a wide frequency range can be covered with a smaller inductance variation if the inductance and capacitance are varied simultaneously. Since the resistance factor in a tuned circuit remains relatively constant when the inductance provided by a saturable reactor is varied by controlling the degree of saturation therein, by reducing the amount of inductance variation required, the Q of the tuned circuit does not vary as much.

It is an object of this invention to provide a radio receiver having a new and improved remote tuning system.

Another object of this invention is to provide an improved remote tuning circuit having capacitive and inductive elements, with both elements being varied simultaneously to provide a wide tuning range and still maintain a high quality factor.

Still another object of the invention is to provide an improved trunk-mounted automobile radio receiver having tuning circuits in accordance with the preceding paragraph in which the adjustment is provided by varying a direct current voltage applied thereto which is controlled at a remote point.

A feature of the invention is the provision of a tuning circuit including a saturable core reactor and a junction diode whose respective inductance and capacitance values are varied simultaneously by applying thereto a direct current voltage controlled by ganged potentiometers which may be located at a remote point.

A further feature of the invention is the provision of an improved radio receiver adapted to be mounted in the trunk of an automobile, which receiver includes a plurality of variable tuned circuits each having a saturable reactor and a junction capacitor which are varied simultaneously by adjusting a single control mechanism located on the dashboard of the automobile. The control mechanism may be connected to the receiver proper by unshielded leads, thereby providing an inexpensive structure.

The invention is illustrated in the drawings in which.

The invention provides a new and improved electrically controlled tuning circuit which facilitates remote control of a radio receiver. The variable tuning circuits of a radio receiver may each include a saturable reactor having a coil wound on a ferro-magnetic core forming the inductive element of a resonant circuit, and a semiconductor diode of the junction type forming the capacitive element of the resonant circuit. The inductance and capacitance values of each resonant circuit are varied simultaneously by controlling the direct current voltage supplied thereto. Since both are varied in the same sense a wide range is provided and a high Q is maintained throughout the entire tuning range of the receiver. The direct current voltage applied to each reactor energizes a magnetizing winding which is magnetically linked to the coil through the ferro-magnetic core thereof for controlling the permeability of the core and thus controlling the inductance of the coil. The direct current voltage applied to the diode is polarized to bias the junction in a "reverse" direction causing the diode to act as a capacitor whose value depends on the level of the biasing voltage. The receiver with the diode and reactor elements in it may be mounted in the trunk of an automobile, and a plurality of potentiometers having a common control mechanism may be mounted on the dashboard of the automobile. The potentiometers are connected to the reactors and diodes in the receiver for applying thereto a potential derived from the battery-generator of the automobile, and these connections may be made by leads which are not shielded.

Figure 1:
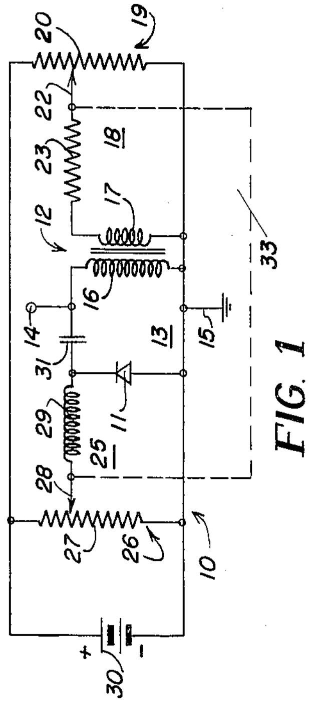
FIG. 1 is a circuit diagram showing a parallel resonant tunable circuit forming one embodiment of the invention.

In FIG. 1 there is shown a tuning circuit designated generally as 10 which includes a diode 11 and a saturable reactor 12 connected in a parallel resonant circuit 13 having a terminal 14 to which high frequency signals are supplied with reference to the ground terminal 15. The saturable reactor 12 includes a coil 16 forming the inductance element of the resonant circuit 13 and which is wound on a ferro-magnetic core of highly permeable material such as ferrite. The saturable reactor also includes a magnetizing winding 17 connected in a direct current control circuit 18, and which is magnetically linked to the coil 16 through its ferro-magnetic core. The control circuit 18 also includes a potentiometer 19 whose resistive element 20 is connected to the battery 30. The direct current flowing through the magnetizing winding 17 produces magnetic flux in the core of the coil 16 which determines its inductance. The amount of this flux is varied by moving the slider 22 of potentiometer 20, and this changes the permeability of the core and consequently changes the inductance of the coil 16.

The diode 11 which forms the variable capacitive element of the resonant circuit 13 is connected to another control circuit 25 which includes a potentiometer 26. A direct current voltage is applied across the resistive element 27 of the potentiometer by the battery 30, and a portion of this voltage is applied from the slider 28 to the diode 11 through a choke coil 29. The coil 29 serves to isolate the potentiometer 26 from the high frequency signals applied to the resonant circuit 13, and the blocking capacitor 31 connected in the resonant circuit serves to isolate the terminal 14 and the coil 16 from the direct current flowing in the control circuit 25.

The diode 11 is a P-N junction type, preferably of silicon or germanium, having a relatively low internal series resistance, and therefore, a relatively high Q or quality factor. The battery 30 is polarized so that the direct current voltage applied to the diode 11 biases the same in a "reverse" direction—that is, with the N region biased positively with respect to the P-region. A depletion layer of dielectric material builds up to a thickness which depends upon the sum of the internal electrostatic potential and the applied voltage. Thus, the diode can be considered as a capacitor having a value which depends on the direct current voltage applied thereto.

When the slider 28 is moved down, the applied voltage is decreased and the capacitance of the diode 11 increases, and, of course, the converse holds when the slider is moved up. When the slider 22 of the control circuit 18 is moved down, the inductance value of the coil 16 is likewise increased. Thus, the potentiometers 19 and 26 can be ganged together as indicated by the dotted line 33 so that the inductance and capacitance values of the resonant circuit 13 are increased or decreased simultaneously to vary the resonant frequency thereof over a relatively wide range, and this simultaneous change in values maintains a more nearly constant Q throughout the range.

Figure 2:
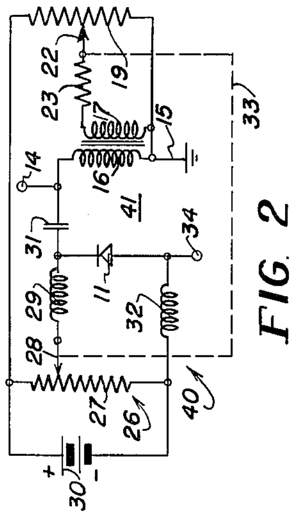
FIG. 2 is a circuit diagram showing a series resonant tunable circuit forming another embodiment of the invention.

The tuning circuit shown in FIG. 1 is particularly suitable for use with a high impedance signal source, such as the plate of a vacuum tube, since the coil 16 and diode 11 form a high impedance parallel resonant circuit 13. Where the signal source has low impedance, such as the antenna of a radio receiver, the tuning circuit 40 shown in FIG. 2 can be used advantageously because the diode 11 and the coil 16 form a low impedance series resonant circuit 41 extending from terminal 34 to the grounded end of coil 16. The configuration of the tuning circuit 40 is generally similar to the circuit 10 except that the input signals are supplied to an input terminal 34 and the output is taken from the terminal 14. An additional choke coil 32 is provided to isolate the potentiometer 26 from the high frequency signals applied to the resonant circuit 41.

Figure 3:
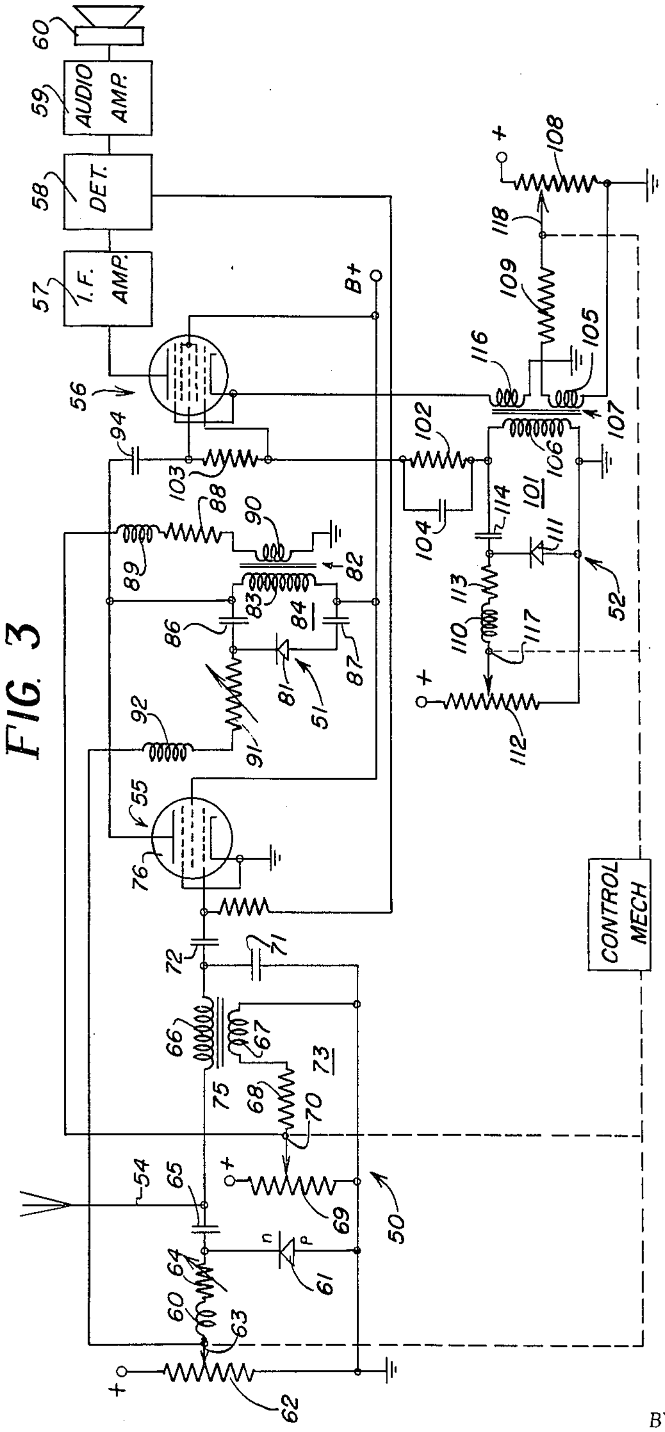
FIG. 3 is a circuit diagram, partly in block form, showing a radio receiver having a remote tuning system in accordance with the invention.

FIG. 3 shows the circuit of a radio receiver having a plurality of electrical tuning circuits 50, 51 and 52 ganged together and controlled by a single control mechanism 53. The tuning circuit 50 provides frequency selection for the antenna 54, the tuning circuit 51 provides frequency selection for the radio frequency amplifier stage 55, and the tuning circuit 52 provides frequency control for the oscillator portion of the mixer or converter stage 56. The remainder of the receiver is shown in block diagram form since the construction and operation thereof are not directly related to the invention.

The tuning circuit 50 includes a P-N junction diode 61 which is biased in a reverse direction by potential applied by the potentiometer 62, and therefore acts as a variable capacitor as previously explained. The diode 61 is connected in a resonant circuit 73 which also includes the coil 66 and the capacitor 71. The resonant circuit 73 is not strictly speaking either a series resonant or a parallel resonant circuit, but rather has properties in between these two and is called a pi circuit. Radio frequency signals are supplied to the resonant circuit 73 from the antenna 54 with reference to ground. The output of the resonant circuit 73 is coupled through blocking capacitor 72 to the signal grid of an amplifier tube 76. Another blocking capacitor 65 isolates the antenna and the coil 66 from the direct current used to control the diode 61, and resistor 64, and choke coil 60 substantially isolate the potentiometer 62 from the signals in the resonant circuit. The potentiometer 69 controls the direct current voltage applied to the magnetizing winding 67 of the saturable reactor 75, and the sliders 63 and 70 are controlled simultaneously by the control mechanism 53 to provide simultaneous inductance and capacitance variation as previously explained.

The tuning circuit 51 includes coil 83 and diode 81 connected in parallel resonant circuit 84 which connects the plate of the radio frequency amplifier tube 76 to B+. Control potentials are applied to the diode 81 and the saturable reactor 82 by the sliders 63 and 70 of potentiometers 62 and 69 so that the circuit 51 is controlled simultaneously with the circuit 50. The blocking capacitor 86 isolates the direct current applied to the diode 81, and the blocking capacitor 84 isolates the B+ potential which is supplied through the coil 83 to the plate of the tube 76. The resistor 88 and choke coil 89 connected to the magnetizing winding 90, and the resistor 91 and choke coil 92 connected to the diode 81 serve respectively to isolate the potentiometers 62 and 69 from signals in the resonant circuit 84. The output of the radio frequency amplifier is supplied through the blocking capacitor 94 to the converter stage 56.

The frequency of the oscillator signals used in the mixer or converter stage 56 is controlled by the tuning circuit 52 having a parallel resonant circuit 101. This circuit is connected in series with resistors 102 and 103 and the capacitor 104 which serve to bias the signal grid and the oscillator grid of the mixer stage 56. The magnetizing winding 105 of the saturable reactor 107 is coupled to potentiometer 108 by resistor 109 and controls the inductance value of the coil 106. The junction diode 111 is coupled to potentiometer 112 by choke coil 110 and resistor 113, and blocking capacitor 114 is included in the resonant circuit 101. The feedback required to sustain oscillations is supplied through the tertiary winding 116 which may be wound on the same core with windings 105 and 106.

The sliders 117 and 118 of the potentiometers 108 and 112 are ganged together and are controlled by the control mechanism 53 along with the potentiometers 62 and 69. The control mechanism including these potentiometers can be mounted remote from the remainder of the receiver, and as an example the control mechanism may be provided on the dashboard of an automobile, and the remainder of the radio receiver including the remainder of the tuning circuits 50, 51 and 52 can be mounted in the trunk of the automobile. The terminals marked plus in FIG. 3 are then connected to the battery-generator voltage source of the automobile. The sliders of the potentiometers are connected to the receiver by leads which do not require shielding so that the resulting structure is relatively inexpensive.

It is apparent from the foregoing description that the invention provides an effective and yet simple tuning system for use in radio receivers which are adapted to be mounted at one point and tuned from a remote point. The tuning circuit of the invention provides a relatively wide tuning range and still maintains a comparatively high quality factor. The tuning circuit is controlled by direct current voltages, and thus the leads extending between the receiver and the control point can be of the cheaper unshielded type.

What is claimed is:

1. A tuner for use in providing tuning of automatic radio receivers adapted to be mounted in automotive vehicles, which tuner is entirely electrically controlled and operable from a direct current voltage source, said tuner including in combination, signal input terminal means, signal output terminal means, saturable reactor means including inductor means coupling said signal output terminal means to a point of reference potential, said saturable reactor means further including a magnetizing winding magnetically coupled to said inductor means by a ferro-magnetic core, P-N junction diode means having capacitance and connecting said signal input terminal means to said inductor means and forming a series resonant circuit therewith, a direct current voltage source, first potentiometer means adapted to be coupled to the voltage source, resistor means coupling said first potentiometer means to said magnetizing winding for applying a direct current voltage thereto thereby determining the inductance value of said inductor means, second potentiometer means adapted to be coupled to the voltage source, choke means coupling said second potentiometer means to said diode means for applying a direct current voltage to said diode means of a polarity to bias the same in a reverse direction for controlling the capacitance value thereof, said choke means substantially isolating said second potentiometer means from high frequency signals conducted by said resonant circuit, and blocking capacitor means in said resonant circuit for substantially isolating said inductor means from the biasing voltage applied to said diode means, said first and second potentiometer means being ganged together and having a common actuator which is adapted to be mounted on a control panel of the vehicle and is operable to vary simultaneously the inductance and capacitance values for tuning said resonant circuit through a wide frequency range.

2. An electrical tuning system for use in a radio receiver which is responsive to radio frequency signals within the broadcast frequency band, and which receiver is adapted to be mounted in an automotive vehicle at a place remote from a control panel of the vehicle and includes an antenna, a radio frequency amplifier stage, and an oscillator-mixer stage, said tuning system being operable from a direct current voltage source and including in combination, a first tuning circuit coupled between the antenna and the radio frequency amplifier stage, a second tuning circuit coupled between the radio frequency amplifier stage and the oscillator-mixer stage, and a third tuning circuit coupled to the oscillator portion of the oscillator-mixer stage, said tuning circuits each including a saturable reactor having an inductor providing voltage dependent inductance, a semiconductor junction diode providing voltage dependent capacitance, and means coupling said junction diode to said inductor forming a resonant circuit, saturation control circuit means applying direct current voltage from the voltage source to said saturable reactors for controlling the inductance of said inductors, bias control circuit means applying direct current voltage from the voltage source to said junction diodes for biasing the same in a reverse direction and for controlling the capacitance thereof, and common actuator means coupled to said saturation control circuit means and said bias control circuit means to operate the same simultaneously and thereby simultaneously vary the inductance and capacitance of each resonant circuit for tuning the radio receiver through the broadcast frequency band, said common actuator menas being adapted to be mounted on the control panel of the vehicle for providing remote electrical tuning control.

3. In automotive radio apparatus including a reciever which is adapted to be mounted in an automotive vehicle for receiving radio signals of frequencies within a predetermined frequency band, a tuning system which is operable electrically from a direct current voltage source, said tuning system including in combination, a resonant signal circuit in the receiver for providing selective translation of radio frequency within the predetermined band, said resonant signal circuit including inductor means and capacitor means both of which are variable to vary the tuning of said resonant circuit, said inductor means including an inductor coil connected in said resonant circuit, a saturable magnetic core for said coil and a saturating winding responsive to a potential applied thereto for providing voltage dependent inductance in said resonant circuit, said capacitance means including a semiconductor diode having a P-N junction which produces capacitance in said signal circuit responsive to reverse bias potential applied to said diode, with the capacitance value of said semiconductor diode being dependent on the level of the reverse bias potential applied thereto, said resonant signal circuit including direct current impedance means coupling said semiconductor diode to said inductor coil and isolating said inductor coil from the bias potential applied to said diode, and direct current control circuit means for varying the tuning of said resonant circuit in order to provide selection of radio frequency signals of any frequency within the predetermined band, said control circuit means including a first direct current circuit connected to said saturating winding and supplying saturating potential thereto, a second direct current circuit connected to said semiconductor diode and supplying reverse biasing potential thereto, said direct current circuits including isolating means for isolating said control circuit means from the radio signals supplied to said signal circuit, and control means including first and second adjustable means for providing variable voltages to said first and second direct current circuits respectively, and manual control means for operating said adjustable means to vary simultaneously the level of the saturating potential and the biasing potential thereby simultaneously varying the inductance value of said inductor coil and the capacitance value of said semiconductor diode in the same sense, whereby the tuning of said resonant circuit is varied through a wide frequency range to provide the frequencies of the predetermined frequency band.

4. In radio apparatus which includes a receiver unit for receiving radio signals of frequencies within a predetermined frequency band, the receiver unit being adapted to be mounted at a place remote from a control point, and which includes a remote tuning unit for mounting at the control point, a remote tuning system which is operable electrically from a direct current voltage source and including in combination, a resonant signal circuit in the receiver unit including inductor means and capacitance means both of which are variable to control the tuning of said resonant circuit, said inductor means including an inductor coil connected in said resonant circuit, a saturable magnetic core for said coil and a saturating winding for providing inductance in said signal circuit which varies with the level of voltage applied to said saturating winding, said capacitance means including a semiconductor diode having a PN junction which produces capacitance in said resonant signal circuit responsive to reverse bias voltage applied to said diode, direct current impedance means coupling said semiconductor diode to said inductor coil and isolating said inductor coil from the bias voltage of said semiconductor diode, and direct current control circuit means for varying the tuning of said resonant signal circuit, said control circuit means including a first direct circuit connected to said saturating winding for applying saturating potential thereto, a second direct current circuit connected to said semiconductor diode supplying reverse biasing potential thereto, said direct current circuits including impedance means for isolating said control circuit means from the radio signals of said signal circuit, and control means mounted in the remote tuning unit and including first and second potentiometer means adapted to be connected to the voltage source and to providing variable voltage to said first and second direct current circuits respectively, and manual control means in the remote tuning unit for operating said adjustable means to vary simultaneously the level of the saturating potential and the biasing potential thereby simultaneously varying the inductance value of said inductor coil and the capacitance value of said semiconductor diode in the same sense for tuning said resonant circuit through a wide frequency range to select the frequencies of the predetermined frequency band.

5. A tuner for use in a radio receiver adapted to be mounted in an automotive vehicle, and which tuner is entirely electrically controlled from a remote panel through direct current connections, said tuner including in combination, saturable reactor means including inductor means, a magnetizing winding and a ferro-magnetic core magnetically coupling said magnetizing winding to said inductor means, a PN junction diode having capacitance coupled across said inductor means and forming a parallel resonant circuit therewith, first potentiometer means adapted to be coupled to a voltage source for deriving a variable direct current voltage therefrom, resistor means coupling said potentiometer means to said magnetizing winding for applying said variable voltage thereto and thereby controlling the inductance value of said inductor means, second potentiometer means adapted to be coupled to a voltage source for deriving a variable direct current bias voltage therefrom, choke means coupling said second potentiometer means to said diode means for applying said direct current bias voltage to said diode means with a polarity to bias the same in a reverse direction for controlling the capacitance value thereof, said choke means substantially isolating said potentiometer means from high frequency signals in said resonant circuit, said resonant circuit including blocking capacitor means coupling said diode means to said inductor means and substantially isolating said inductor means from the bias voltage applied to said diode means, manual control means coupled to said first and second potentiometer means for common actuation thereof, and a remote control panel adapted to be mounted on the vehicle, said potentiometer means and said manual control means being mounted on said remote control panel and operable to vary simultaneously the inductance and capacitance values of said resonant circuit for tuning the same through a wide frequency range.

6. In automotive radio apparatus which is adapted to be mounted in an automotive vehicle for translating radio signals of frequencies within a predetermined frequency band, a remote tuning system which is operable electrically from a direct current voltage source, said tuning system including in combination, resonant signal circuit means for providing selective translation of radio frequency signals of selected frequency within the predetermined band, said resonant signal circuit means including inductor means and capacitance means, manual control means positioned remotely from said resonant signal circuit means and providing direct current voltages to said resonant signal circuit means for changing the tuning thereof to different frequencies in said predetermined band, said capacitance means including a semiconductor diode having a PN junction which produces capacitance in said resonant signal circuit means in response to reverse bias potential applied to said diode, said manual control means including a direct current circuit connected to said semiconductor diode and adjustable means for applying a variable voltage thereto, with the capacitance value of said semiconductor diode varying with the value of the voltage applied by said direct current circuit and which forms a reverse bias for said diode, said resonant signal circuit means including direct current impedance means coupling said semiconductor diode to said inductor means and isolating said inductor means from the bias voltage of said semiconductor diode, said direct current circuit including means for isolating said manual control means from the radio signals supplied to said resonant signal circuit means, said manual control means being coupled to said resonant signal circuit means only through said direct current circuit and forming the sole means for changing the tuning thereof, whereby said resonant circuit is remotely tuned to different frequencies of the predetermined frequency band in response to operation of said manual control means.

References Cited in the file of this patent

UNITED STATES PATENTS

| | | |
|---|---|---|
| 2,182,377 | Guanella | Dec. 6, 1939 |
| 2,508,138 | Bernstein | May 16, 1950 |
| 2,526,207 | Donley et al. | Oct. 17, 1950 |
| 2,581,202 | Post | Jan. 1, 1952 |
| 2,611,094 | Rex | Sept. 16, 1952 |
| 2,810,826 | Hargens | Oct. 22, 1957 |
| 2,899,601 | Simmons | Aug. 11, 1959 |
| 2,915,631 | Nilssen | Dec. 1, 1959 |

OTHER REFERENCES

"A Variable-Capacitance Germanium Junction Diode," by Giacoletta and O'Connell in "RCA Review," March 1956, pages 68–85.